(12) United States Patent
Noice et al.

(10) Patent No.: US 9,262,359 B1
(45) Date of Patent: Feb. 16, 2016

(54) METHOD AND SYSTEM FOR IMPLEMENTING PIPELINE FLIP-FLOPS

(75) Inventors: David C. Noice, Palo Alto, CA (US); Anurag Tomar, San Jose, CA (US); Scot A. Woodward, Santa Clara, CA (US); Adrian Aloysius Hendroff, Dublin (IE); Dennis Huang, Palo Alto, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 782 days.

(21) Appl. No.: 12/631,376

(22) Filed: Dec. 4, 2009

(51) Int. Cl.
*G06F 17/50* (2006.01)
*G06F 13/40* (2006.01)

(52) U.S. Cl.
CPC ........ *G06F 13/4022* (2013.01); *G06F 17/5045* (2013.01)

(58) Field of Classification Search
CPC . G06F 17/50; G06F 15/7878; G06F 17/5045; G06F 2217/84
See application file for complete search history.

(56) References Cited

U.S. PATENT DOCUMENTS

| 6,081,656 | A | * | 6/2000 | Witt | 716/103 |
|---|---|---|---|---|---|
| 6,711,724 | B2 | * | 3/2004 | Yoshikawa | 716/114 |
| 6,834,378 | B2 | * | 12/2004 | Augsburg et al. | 716/113 |
| 6,941,541 | B2 | * | 9/2005 | Snider | 716/103 |
| 6,952,816 | B2 | * | 10/2005 | Gupta et al. | 716/103 |
| 7,207,024 | B2 | * | 4/2007 | Scheffer | 716/114 |
| 7,546,560 | B2 | * | 6/2009 | Dirks et al. | 716/135 |
| 8,607,178 | B2 | * | 12/2013 | Taylor et al. | 716/114 |
| 2008/0066040 | A1 | * | 3/2008 | Taylor et al. | 716/10 |
| 2012/0221993 | A1 | * | 8/2012 | Taylor et al. | 716/114 |

* cited by examiner

*Primary Examiner* — A. M. Thompson
(74) *Attorney, Agent, or Firm* — Vista IP Law Group, LLP

(57) ABSTRACT

Disclosed is a method, system, and computer program product for automated implementation of pipeline flip-flops in an electronic design. Two operating modes can be used either together or separately to implement pipeline flip-flops. An analysis mode is employed to perform a determination of the number of stages of pipeline flip-flops needed for particular portions of an electronic design. A placement stage is used to place the pipeline flip-flops in the layout.

24 Claims, 10 Drawing Sheets

METHOD AND SYSTEM FOR IMPLEMENTING PIPELINE FLIP-FLOPS

BACKGROUND

An integrated circuit (IC) has a large number of electronic components, such as transistors, logic gates, diodes, and wires that are fabricated by forming layers of different materials and of different geometric shapes on various regions of a silicon wafer.

Many phases of physical design may be performed with computer aided design (CAD) tools or electronic design automation (EDA) systems. To design an integrated circuit, a designer first creates high level behavior descriptions of the IC device using a high-level hardware design language.

An EDA system typically receives the high level behavior descriptions of the IC device and translates this high-level design language into netlists of various levels of abstraction using a computer synthesis process. A netlist describes interconnections of nodes and components on the chip and includes information of circuit primitives, such as for example, transistors and diodes, their sizes and interconnections.

An integrated circuit designer may use a set of layout EDA application programs to create a physical design of the IC from the logical design. The layout EDA application uses geometric shapes of different materials to create the various electrical components on an integrated circuit and to represent electronic and circuit IC components as geometric objects with varying shapes and sizes. The geometric information about the placement of the nodes and components onto the chip may be determined by a placement process and a routing process. The placement process is a process for placing electronic components or circuit blocks on the chip and the routing process is the process for creating interconnections between the blocks and components according to the specified netlist.

The problem being addressed by the present invention is caused by the tendency of many modem electronic designs to become extremely large, with larger die sizes and more complex floorplans. This results in longer connections between routing end-points within the electronic designs, so that it is becoming impossible for an unassisted signal to travel from one end-point to another in a single clock cycle.

To address this problem, the electronic designer inserts pipeline flip-flops or pipeline registers (hereinafter collectively referred to as "pipeline flip-flops") between start-points and end-points in a route between two points. In this way, the signals transmitted between the two points will be kept in proper synchronization for the given clock cycles.

Figure 1:
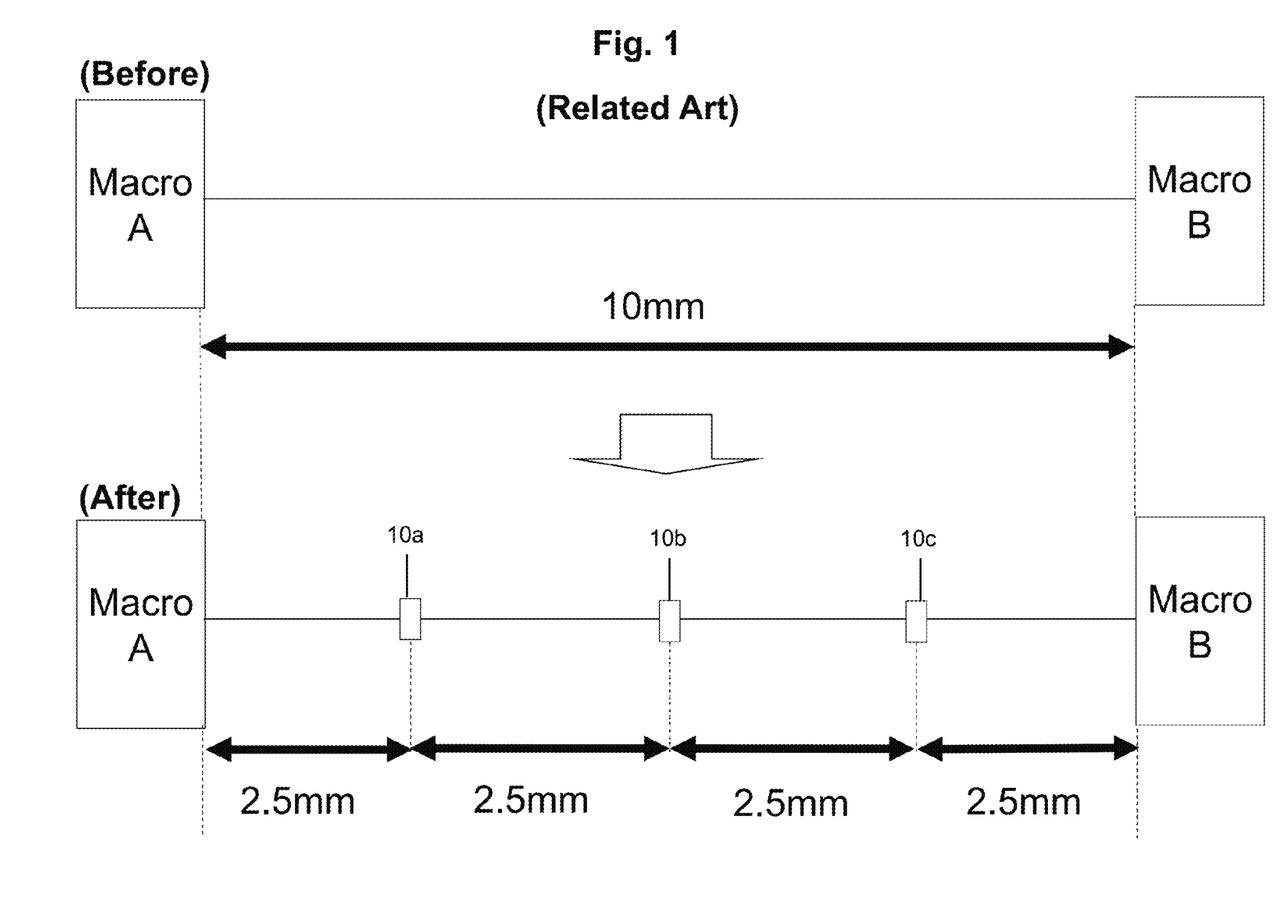
FIG. 1 illustrates insertion of pipeline flip-flops.

FIG. 1 shows a very simple example of this process, in which a designer is required to route a net between Macro A and Macro B. The "before" situation is shown at the top part of the figure, in which it can be seen that there is a 10 mm distance between Macro A and Macro B. Assume that this distance is too long to allow a signal to get from Macro A to Macro B within a single clock cycle. To address this problem, the designer could create a revised routing scheme by inserting three pipeline flip-flops 10a, 10b, and 10c along the route, with equal distances of 2.5 mm between any two points along the revised route, which is shown in the "after" situation at the bottom of the figure.

Figure 2:
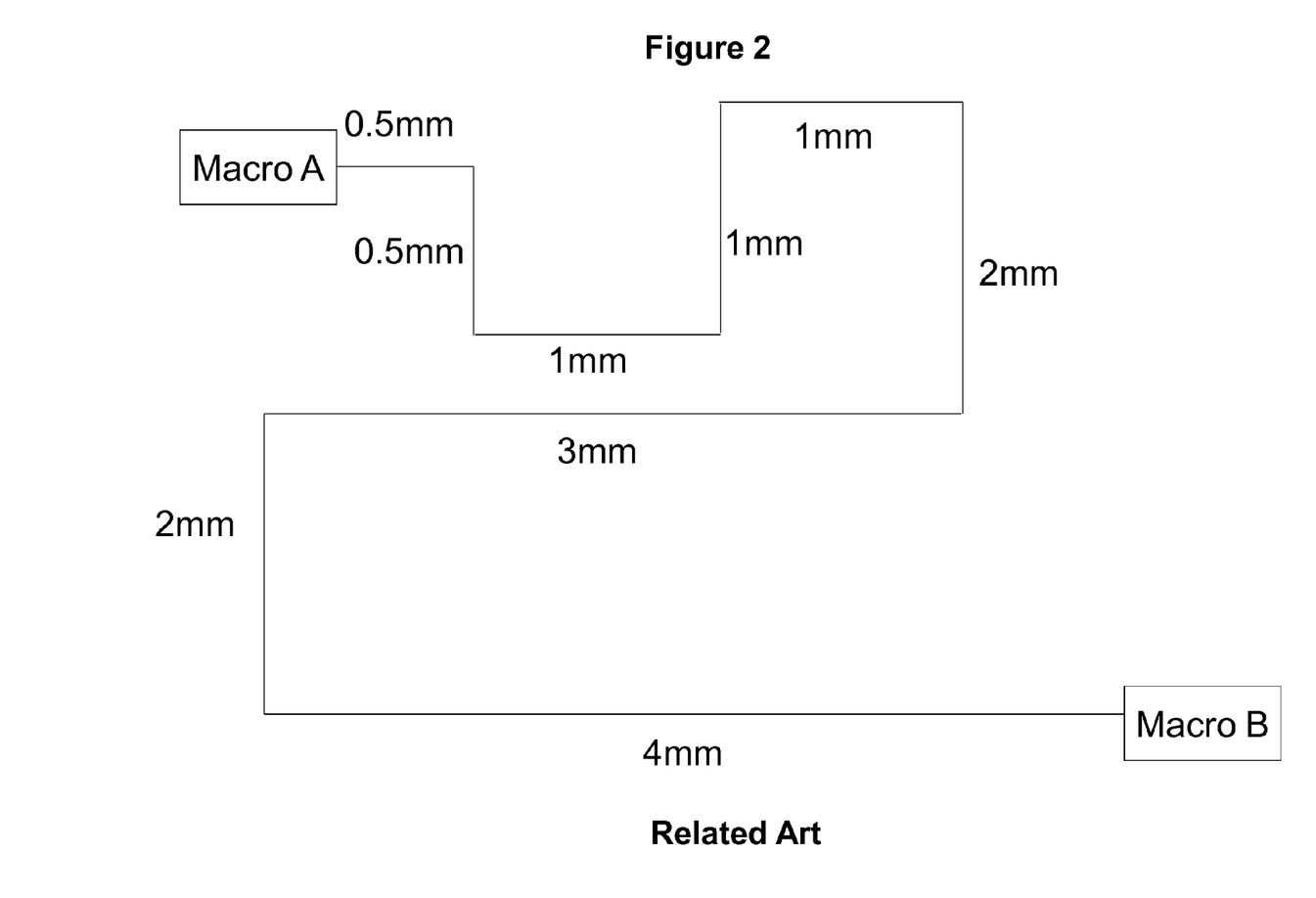
FIG. 2 illustrates a complex net for which pipeline flip-flops may be needed.

Conventionally, the process to insert pipeline flip-flops into a design is highly manual in nature, with a designer commonly required to individually consider and analyze nets in the design to determine where and when pipeline flip-flops need to be inserted into the design. This is a tedious and error-prone task if performed manually. Moreover, if there are a very large number of nets in a design (which is likely given that the present problem arises because of larger and more complex designs), then the amount of effort needed to perform the analysis may become overwhelming. The task for the design is further complicated by the fact that many nets in the design are not routed along nicely straight routing paths as shown in FIG. 1. Instead, as shown in FIG. 2, many routing paths extend along complex and winding paths, making it even more difficult for a designer to determine the ideal pipeline flip-flop positions for the routing path.

Therefore, as is evident from the above discussion, there is a need for an improved approach for placement of pipeline flip-flops in an electronic design.

SUMMARY

Embodiments of the present invention provide a method, system, and computer program product for automated implementation of pipeline flip-flops in an electronic design. Embodiments of the present invention provide two operating modes that can be used either together or separately to implement pipeline flip-flops. An analysis mode is employed in some embodiments to perform a determination of the number of stages of pipeline flip-flops that are needed for particular portions of an electronic design. A placement mode is used in some embodiments to place the pipeline flip-flops in the layout.

Other and additional objects, features, and advantages of the invention are described in the detailed description, figures, and claims.

DETAILED DESCRIPTION

Embodiments of the present invention provide a method, system, and computer program product for automated implementation of pipeline flip-flops in an electronic design. Embodiments of the present invention provide two operating modes that can be used either together or separately to implement pipeline flip-flops. An analysis mode is employed in some embodiments to perform a determination of the number of stages of pipeline flip-flops that are needed for particular portions of an electronic design. A placement mode is used in some embodiments to place the pipeline flip-flops in the layout.

One advantage of the present approach is that it provides an automated approach for analyzing how many pipeline stages are needed based on a given floorplan. This is accomplished by routing buses before pipeline flip-flops are present and reporting to the user the number of stages that are needed.

Another advantage of the present approach is that it provides automatic, routing-driven placement of pipeline flip-flops. This is accomplished by creating artificial nets for a "pseudo-bus" (e.g., a placeholder bus) from the start of the real bus directly to the end of the bus, routing the pseudo-bus, and then placing the flip-flops along the pseudo-bus routes in an equally spaced manner. There are no known tools that can perform this type of automation for placing pipeline flip-flops.

In addition, as described in more detail below, embodiments of the present invention provide for the use of "bus-guides" to allow simple user control of the pipeline flip-flops. A bus-guide is a floorplan object for a group of nets or a bus, which provides geometric guidance to the router for routing the wires for all the member nets. The present approach also provides an automated way of creating bus-guides for the design.

Figure 3:
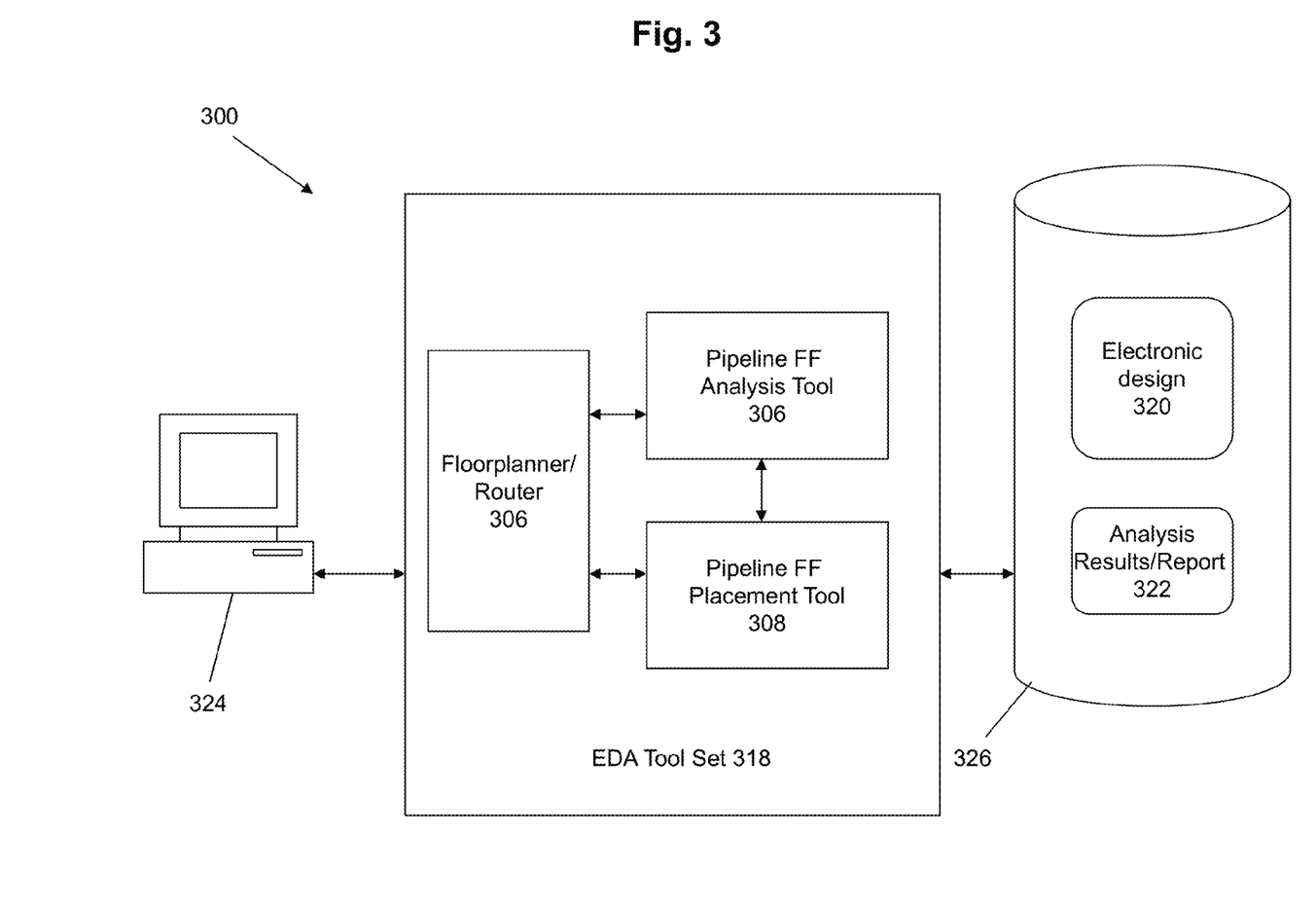
FIG. 3 illustrates an example system 100 which may be employed in some embodiments of the invention to allow efficient access to stream data.

FIG. 3 illustrates an example system 300 which may be employed in some embodiments of the invention to implement automated placement and analysis of pipeline flip-flops. System 300 may include one or more users at one or more user stations 324 that operate the system 300 to access electronic designs 320 and to use an EDA toolset 318 to view, modify, or review the electronic design 320. Such users include, for example, design engineers. User station 324 comprises any type of computing station that may be used to operate, interface with, or implement EDA applications or devices. Examples of such user stations 324 include for example, workstations, personal computers, or remote computing terminals. User station 324 comprises a display device, such as a display monitor, for displaying processing results 322 to users at the user station 324. User station 324 also comprises input devices for user to provide operational control over the activities of system 300.

The electronic designs 320 may be stored in a computer readable storage device 326. Computer readable storage device 326 comprises any combination of hardware and/or software that allows for ready access to the data that is located at the computer readable storage device 326. For example, computer readable storage device 326 could be implemented as computer memory operatively managed by an operating system. The computer readable storage device 326 could also be implemented as an electronic database system having storage on persistent and/or non-persistent storage. According to the present embodiment, the electronic design 320 and analysis results 322 are placed into the computer readable storage device 326.

The EDA toolset 318 may be used by users of a user station 324 to create, access or read the electronic design 320. For example, the EDA toolset 318 may include a floorplanning/routing tool 306. A floorplanning tool is employed to generate a floorplan of an electronic design 320, e.g., to specify the physical locations of design blocks on a layout. A routing tool is used to specify the physical locations for the nets of the electronic design 320 in the layout.

According to some embodiments of the invention, the EDA toolset 318 also includes a pipeline flip-flop analysis tool 306. The pipeline flip-flop analysis tool 306 performs an analysis flow to determine the number of stages of pipeline flip-flops for the electronic design 320. This analysis flow occurs after the floorplanning step, and has the main purpose of evaluating the number of pipeline flip-flops that are needed for longer nets in the electronic design 320. The output of the pipeline flip-flop analysis tool 306 may be reported to the user at user station 324 to be displayed on a display device and/or stored as analysis results 322 in the computer readable storage device 326.

The EDA toolset 318 may also include a pipeline flip-flop placement tool 308. The pipeline flip-flop placement tool 308 perforans an implementation flow to place pipeline flip-flops in the electronic design 320. The pipeline flip-flop placement tool 308 operates by placing the newly added pipeline flip-flops based upon identified spacing requirements, e.g., as determined by the pipeline flip-flop analysis tool 306.

One notable attribute of some embodiments is that placement of the pipeline flip-flops by the pipeline flip-flop placement tool 308 would occur after routing was performed by the router 306. This is the reverse order of conventional EDA tools, in which routing typically occurs after placement.

Some embodiments of the invention are premised upon the assumption that a single pipeline flip-flop chain has zero or more flip-flops that form the pipeline stages for a single bus-bit. The pipeline flip-flops are all flip-flops (or latches) with a D input and Q output, and scan pins (if used) that can be identified by way of a definition file.

Each pipeline flip-flop chain in a pipeline has the same number of stages as the other chains in that pipeline. The nets of one chain should follow the following rules:

Each net is only connected to two terminals, except scan (in/enable) connections which are ignored.

The terminals of each net are only from a Q output to a D input, except for the start/end terminals.

The start/end terminals should be on pre-placed cells.

Figure 4:
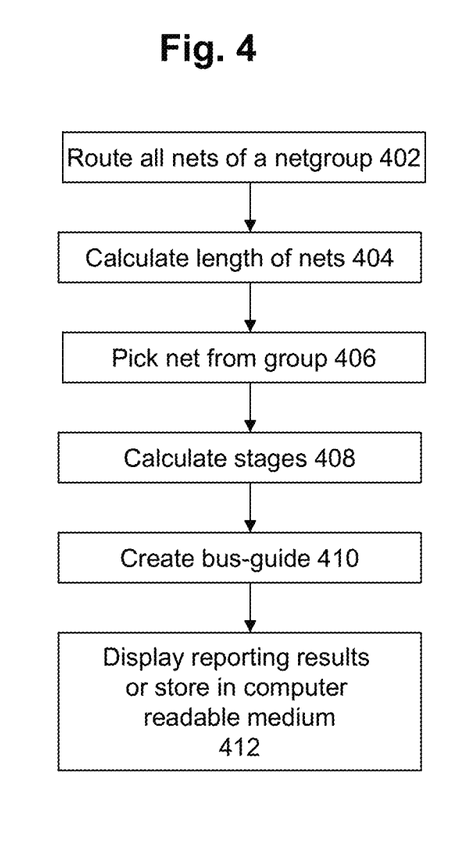
FIG. 4 shows a flowchart of an approach for implementing an analysis tool/flow according to some embodiments of the invention.

As noted above, the pipeline flip-flop analysis flow/tool is used to determine the number of pipeline flip-flop stages for a portion of an electronic design. FIG. 4 shows a flowchart of an approach for implementing the pipeline flip-flop analysis flow/tool. At 402, the tool defines a "netgroup", and routes all nets within the defined netgroup. A netgroup corresponds to a group of nets for a bus that extends from a cluster of associated start points (e.g., all belonging to a module, or an IP block) to a similar cluster of end-points. Any conventional router or routing approach may be taken to route the nets of the netgroup.

Once the nets have been routed, then at 404, calculations are made to determine the length of the nets. This can be accomplished according to any suitable approach, e.g., by tracing and identifying the length of each segment along a net, and then summing all of the segment lengths to arrive at the total length of the net.

Next, at 406, a representative net is selected from the group of nets within the netgroup. The representative net provides the baseline length that will be used to calculate the number of flip-flop stages in the design. Therefore, the representative net provides a length parameter that would be used to perform the pipeline flip-flop analysis.

There are a number of ways decide upon the representative net. One possible approach to selecting the representative net is to select the net having a length value that is closest to the median or mid-length value for the entire netgroup. Another possible approach is to select the net having the shortest length, with the understanding that this approach may be overly optimistic with regard to the length of the routing geometries that will eventually be placed on the layout. Yet another possible approach is to select the net having the longest length, with the understanding that this approach may be overly pessimistic with regard to the final layout.

At 408, the number of stages is determined. This is accomplished by using the following equation:

Number of Stages=(Net-length)/(MaxWire Distance Between Flip-Flops)−1

The Net-Length value refers to the length of the representative net that was determined in 406. The MaxWire Distance refers to the maximum distance that has been established for the design that can be permitted between each pipeline flip-flop in the nets of the design. In some embodiments, this is provided by the user. To illustrate how a user can calculate the MaxWire Distance, consider an example system-on-a-chip (SoC) in which the fastest clock is a 500 MHZ clock, i.e., having a 2 ns period. Assume that the longest wire that connects a start point and an end-point is 15 mm, that there is a rule that a given wire should not exceed 500 urn, and that if buffers are inserted, then there is 300 ps wire delay every 500 um per buffer. Under this circumstance, for the longest wire, 6.67 buffers are needed based upon calculating (2 ns)/(300 ps). This means that the distance should be 3.3 mm based upon the calculation of (6.67)×(500 um). As a result, the user may specify that the max wire length between flip flops should be conservatively set at 3 mm.

Therefore, if the length of the representative net is 15 mm, then the number of stages for the netgroup would be (15 mm)/(3 mm)−1=4 stages (group of flops).

At 410, an optional step could be to create a bus-guide for the layout. By creating a bus-guide, a router will then know to place all routes for those associated nets inside the bus-guide on the preferred layers. The bus-guides are defined to provide enhanced control over routing patterns. As described in more detail below, one advantage from creating the bus-guide is that during the later process of placing the pipeline flip-flops, the bus-guides provide a physical pathway for locating the pipeline flip-flops. The Encounter® product available from Cadence Design Systems of San Jose, Calif. is an example of a tool that is commercially available and that is capable of creating and using bus-guides.

Figure 5:
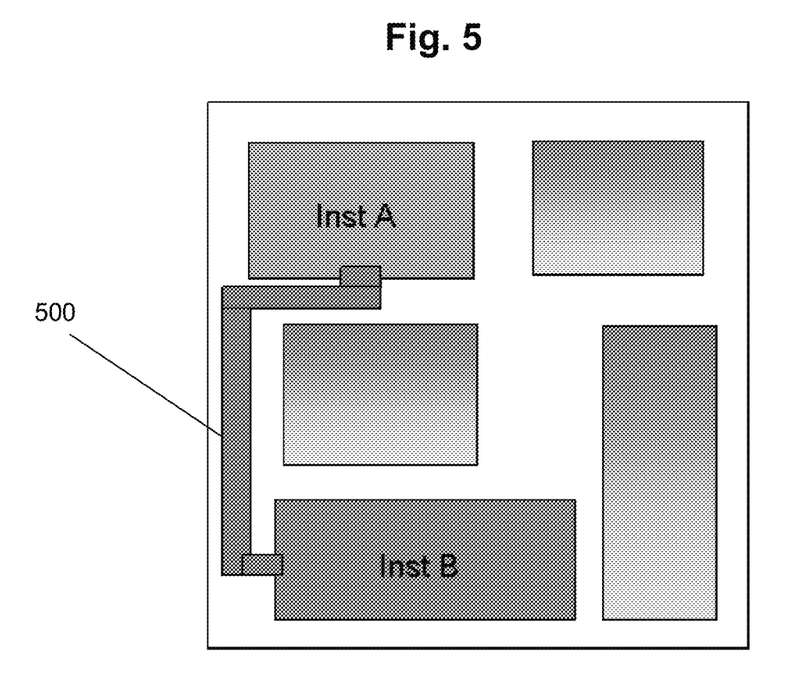
FIG. 5 illustrates an example floorplan having a bus-guide.

FIG. 5 shows an example floorplan in which a bus-guide 500 has been inserted between Block A and Block B. As a result, any nets associated with the bus-guide 500 will be routed along the physical locations corresponding to the bus-guide.

At 412, the reporting occurs to report the expected number of pipeline flip-flop stages for each netgroup. The reporting may occur by displaying analysis results on a display device. Alternatively, the analysis results may be stored onto a computer storage medium.

Figure 6:
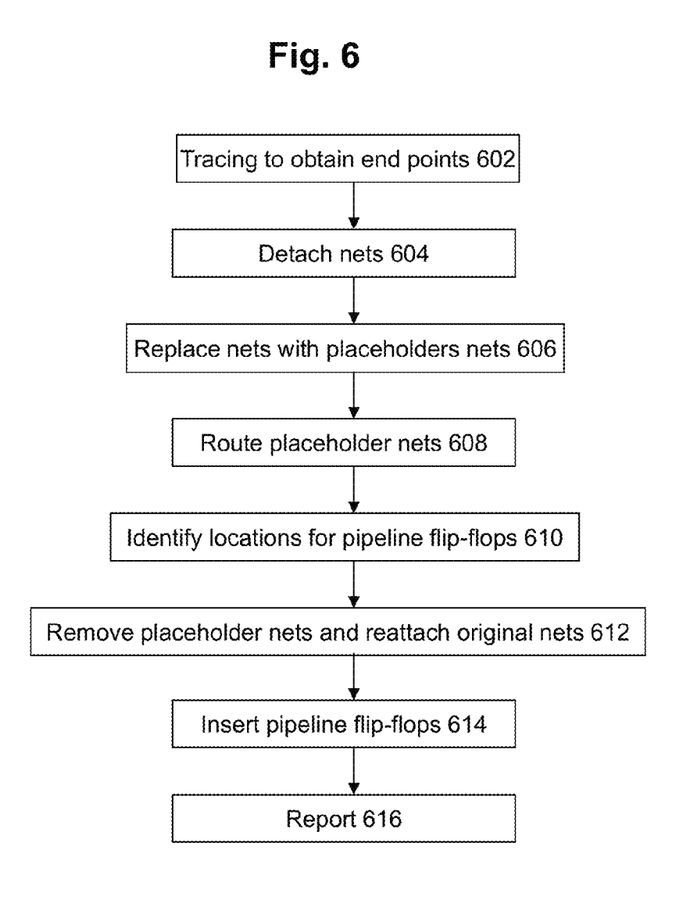
FIG. 6 shows a flowchart of an approach for implementing a placement tool/flow according to some embodiments of the invention.

This document will now describe how the implementation flow/tool is operated to place pipeline flip-flops in the electronic design. FIG. 6 shows a flowchart of an approach for implementing placement of pipeline flip-flops. The nets will already be configured to include pipeline flip-flops, although at this stage the pipeline flip-flops have not been placed and are not associated with a physical location on the layout.

Referring to FIG. 6, at 602, tracing is performed to identify end-points for each "bit" of a netgroup. A bit in this context refers to a set of nets that constitutes a path that replaced one original net before pipeline flop insertion.

The reason this action is being taken is because the original nets that was the subject of the analysis phase may no longer exist, since other design elements have been introduced into the netlist, such as buffers, flip-flops, etc. Therefore, the original nets have become broken up into a greater number of smaller nets. The action of 602 is to attempt to identify actual start points and end-points of the overall nets in the bus for which pipeline flip-flops need to be placed. Any suitable approach can be taken to perform this type of tracing. For example, techniques commonly employed for scan tracing can also be employed here to trace nets from start points to end-points.

Figure 7:
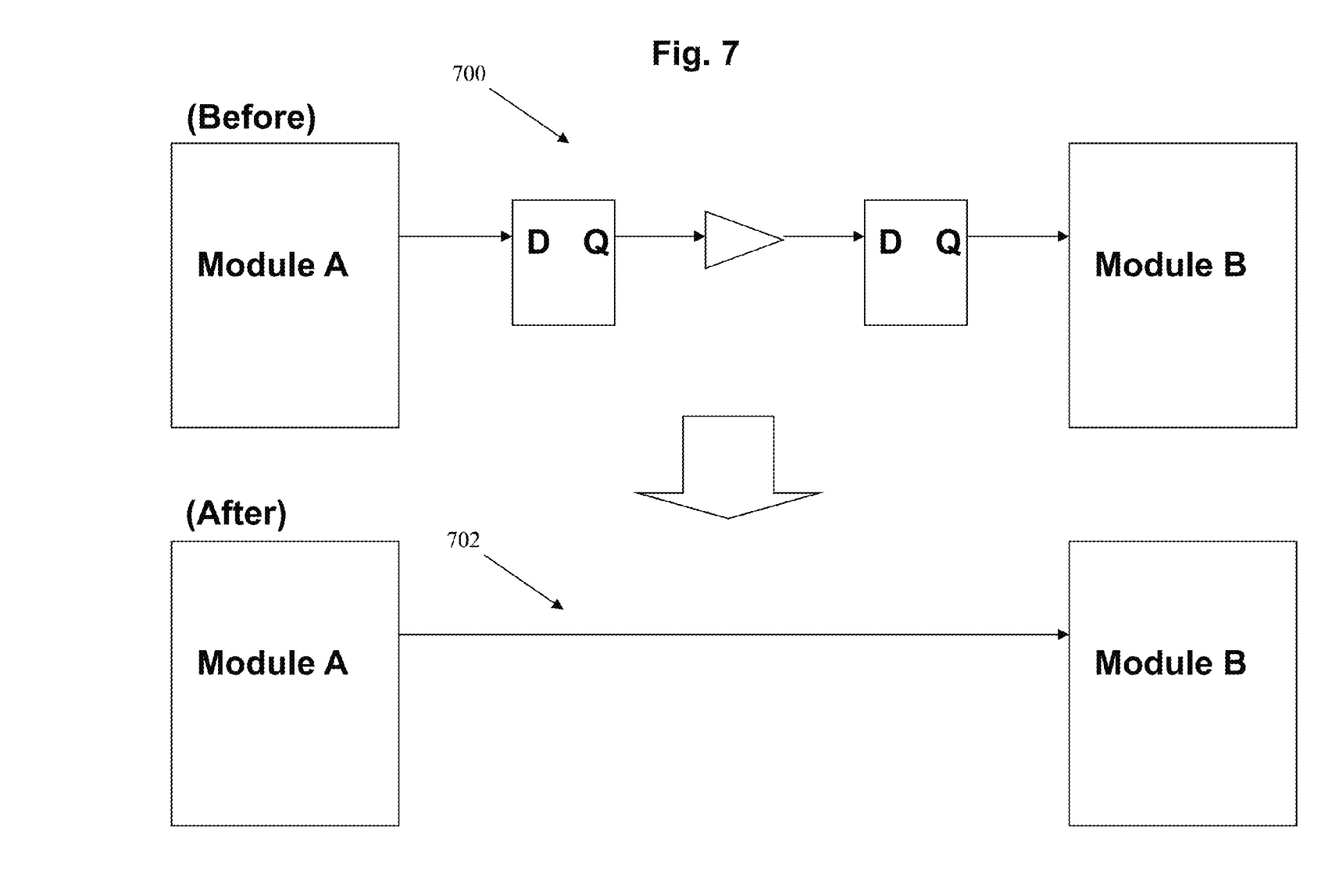
FIG. 7 illustrates replacement of a net with a placeholder net.

Next, at 604, the nets are detached from the identified end-points. At 606, the nets are replaced with placeholder nets that connect start points to end-points for each bit. This is illustrated in FIG. 7, in which the "before" situation shown at the top of the figure illustrates a net 700 having a start point A and an end-point B, where there are several design elements in the net between points A and B. This original net 700 is replaced with a placeholder net 702 that directly connects from points A to B.

Referring back to FIG. 6, at 608, the placeholder nets for each bit are routed on the layout. If a bus-guide is being used, then the nets are routed along the bus-guide. If bus-guides are not being used, then the nets are routed in a manner in which the geometries associated with the wires may theoretically exist anywhere that is legal on the layout. At this point, a choice is made of a representative net for further analysis. Much like the decision point for the analysis flow discussed above, the mid-length net can be selected as the representative net for the present flow to place the flip-flops.

At 610, locations are identified for the pipeline flip-flops along the representative routing path. According to the present embodiment, the pipeline flip-flops are placed at equi-distant locations along the representative routing path. The locations are calculated based upon using the following equation:

Distance ($D$)=(net length)/(number of stages+1)

The "net length" value refers to the length of the representative net. The number of stages is already known by this point, and is the same as the number of flip-flops on each bit of the netgroup.

The routing path for the net is traversed over the distance D from the start point to set the first location for a pipeline flip-flop. This is repeated until the entirety of the net has been traversed.

Next, at 612, the placeholder nets are removed and the original nets are re-attached to the end-points. Based upon the locations specified by 610, the pipeline flip-flops are, at 614, inserted into the layout in legal locations as close as possible to those identified locations. This is illustrated in FIG. 8, in which the first and second stage flip-flops 804 and 806 are inserted at locations along a bus-guide 802 at equidistant distances between the start point 808 and the first stage 804, the first stage 804 and the second stage 806, and the second stage 806 to the end-point 810.

Figure 8:
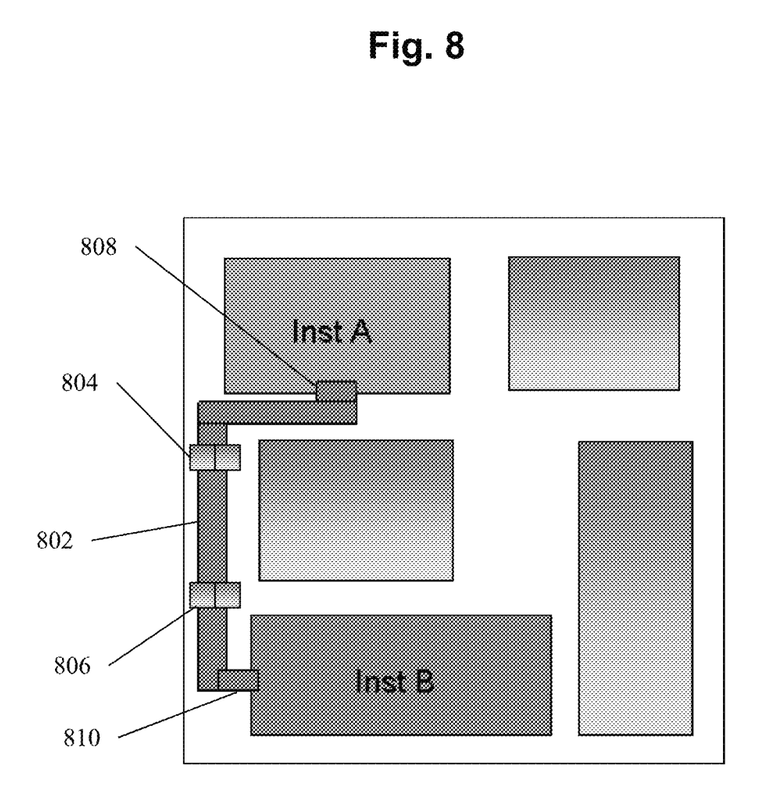
FIGS. 8-9 illustrate insertion of pipeline flip-flops.
Figure 9:
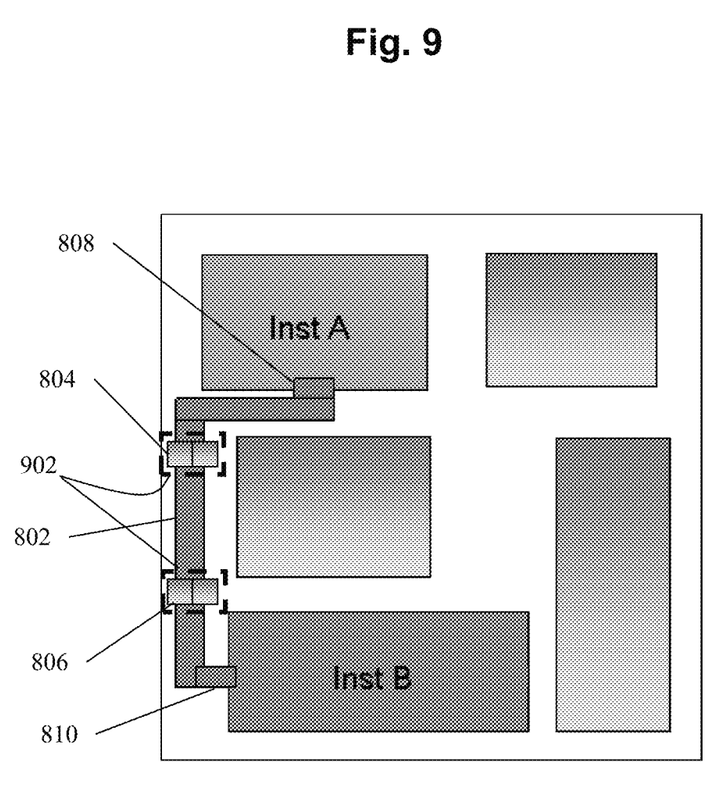

It is noted that the flip-flops may be inserted either using fixed locations as described with respect to FIG. 8, or by using approximate locations. As shown in FIG. 9, a region-based structure, such as a bounding box 902, may be specified to define the boundaries of the possible locations for the flip-flops. The pipeline flip-flops may be placed anywhere within the bounding box 902. This approach provides flexibility for the location of the flip-flops in the event that other structures need to be placed in the layout near the flip-flops.

Reporting is performed at 616 to report the results of placing the pipeline flip-flops. The results may be displayed to a user on a display device or stored in a computer storage medium. A final analysis report may be generated as a post placement and routing report to identify actual route lengths that are achieved.

The present approach may be implemented by first running the analysis flow described with respect to FIG. 4. The analysis flow is useful in determining the number of flips-flops that are needed to achieve net-delays for given clock period. In the alternative, when pipeline flip-flops already exist in netlist, the netgroups may be extracted from the electronic design by iterating through the flips flops and tracing backwards and forwards to reach the end-points. The same module end-points are grouped together at both ends, and associated with the same netgroups. It is noted if the netgroups have not been previously identified, e.g., by executing the analysis flow, then this action to identify the netgroups is performed prior to the actions of 602 in FIG. 6.

Therefore, what has been described is an improved approach for implementing pipeline flip-flops. The present approach provides an automated approach for analyzing how many pipeline stages are needed based on a given floorplan, and reports that number. Embodiments also provide for the optional creation of bus-guides for the netgroups so that a user can see the path and optionally modify it.

In addition, embodiments of the invention provide for automatic, routing-driven placement of pipeline flip-flops. This is accomplished by creating artificial "placeholder" nets for a pseudo-bus from the start of the real bus directly to the end of the bus, e.g. by ignoring pipeline flip-flops and/or buffers. The pseudo-bus is routed and then the flip-flops are placed along the pseudo-bus routes in an equally spaced manner.

It is important to note that some embodiments employ bus-guides to allow efficient control over implementation of the pipeline flip-flops. The concept of bus-guides is combined with pipeline flip-flop placement by inserting the previously-mentioned pseudo-bus into the bus-guide before the routing phase so that the router has a guide for routing those nets, and then removing the pseudo-bus at the end. Combining the bus-guide with the automatic, routing-driven placement makes pipeline flip-flop placement and management more controlled and predictive for users.

SYSTEM ARCHITECTURE OVERVIEW

Figure 10:
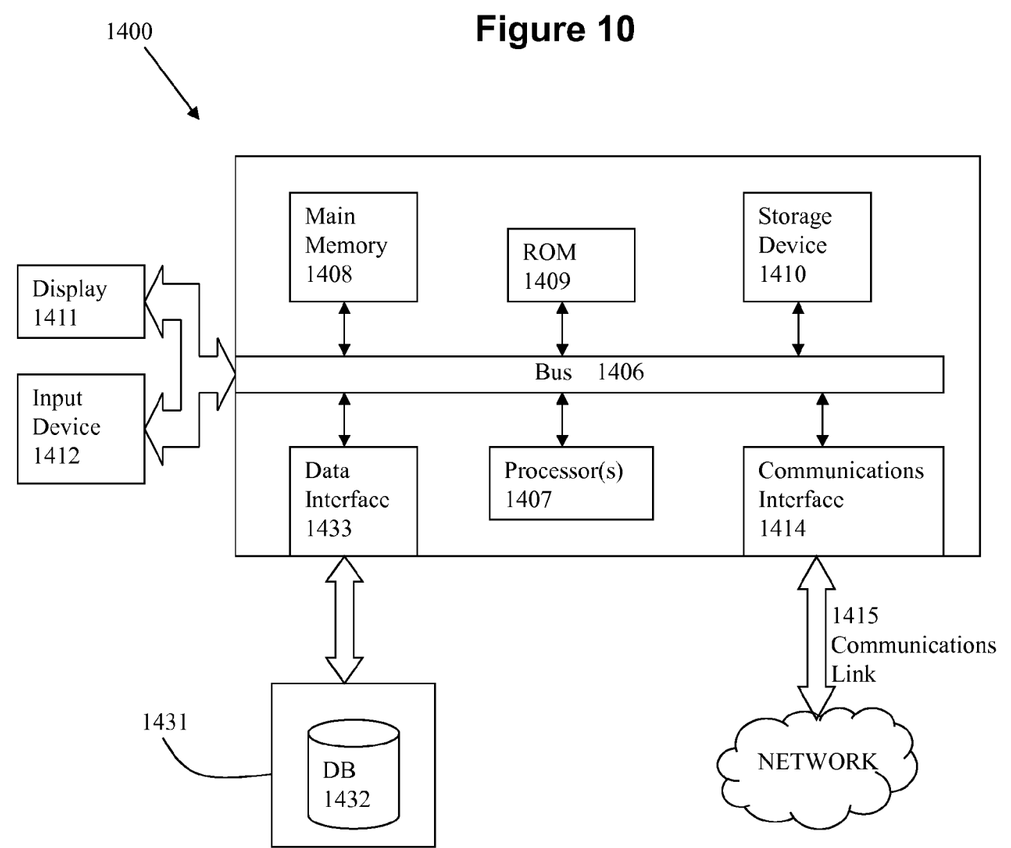
FIG. 10 illustrates an example computing architecture with which the invention may be implemented.

FIG. 10 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer implemented method using a processor for implementing pipeline flip-flops in an electronic design, comprising:
   performing analysis to determine a number of stages of the pipeline flip-flops for the electronic design, wherein the analysis comprises:
      routing a group of nets from the electronic design;
      selecting a representative net from the group of nets;
      calculating a length of the representative net; and
      determining the number of the stages of the pipe-line flip-flops from the length of the representative net;
   automatically placing, by using a processor, the pipeline flip-flops in the electronic design, wherein placing the pipeline flip-flops comprises:
      replacing a net in the electronic design with a placeholder net;
      routing the placeholder net within the electronic design to generate a routing path;
      identifying locations for the pipeline flip-flops along the routing path for the placeholder net, wherein the number of the stages of the pipeline flip-flops corresponds to the number of pipeline flip-flops for which the locations are identified along the routing path;
      removing the placeholder net:
      inserting the net back into the circuit design;
      placing the pipeline flip-flops at the locations that were identified for the pipeline flip-flops; and
   displaying results of automatically placing the pipeline flip-flops in the electronic design on a display device or storing the results of automatically placing the pipeline flip-flops in the electronic design in a non-transitory computer readable storage medium.

2. The computer-implemented method of claim 1, in which a longest net in the group of nets is selected as the representative net.

3. The computer-implemented method of claim 1, in which the number of the stages is determined by dividing the length of the representative net by a desired maximum wire length between the pipeline flip-flops.

4. The computer-implemented method of claim 1, further comprising creating a bus-guide.

5. The computer-implemented method of claim 1, wherein the net in the electronic design is replaced with the placeholder net by tracing the net between a start point and an end points to form a path which is then detached and replaced by the placeholder net.

6. The computer-implemented method of claim 1, in which the placeholder net is routed along a bus-guide.

7. The computer-implemented method of claim 1, in which the locations for the pipeline flip-flops are placed at equidistant locations along the routing path for the placeholder net.

8. The computer-implemented method of claim 1, in which the locations for the pipeline flip-flops are specified by approximate locations using a region-based structure having a bounding box to define boundaries of possible flip-flop locations.

9. A system for implementing pipeline flip-flops in an electronic design, comprising:
a processor; and
a memory for holding programmable code executable by the processor to execute a process for implementing pipeline flip-flops in an electronic design,
wherein the programmable code includes instructions to perform analysis to determine a number of stages of the pipeline flip-flops for the electronic design, wherein the analysis comprises routing a group of nets from the electronic design, selecting a representative net from the group of nets, calculating a length of the representative net, and determining the number of the stages of the pipe-line flip-flops from the length of the representative net; and
the programmable code further includes instructions executable by the processor to automatically place the pipeline flip-flops in the electronic design, wherein placing the pipeline flip-flops comprises replacing a net in the electronic design with a placeholder net, routing the placeholder net within the electronic design to generate a routing path, identifying locations for the pipeline flip-flops along the routing path for the placeholder net, wherein the number of the stages of the pipeline flip-flops corresponds to the number of pipeline flip-flops for which the locations are identified along the routing path, removing the placeholder net, inserting the net back into the circuit design, and placing the pipeline flip-flops at the locations that were identified for the pipeline flip-flops.

10. The system of claim 9, in which the net is the representative net selected from the group of nets is based upon a median length.

11. The system of claim 9, in which the number of the stages is determined by dividing the length of the net by a maximum wire length between the pipeline flip-flops.

12. The system of claim 9, in which the programmable code further includes instructions to create a bus-guide.

13. The system of claim 9, in which the programmable code further includes instructions to trace the net between a start point and an end-point to form a path which is then detached and replaced by the placeholder net.

14. The system of claim 9, in which the placeholder net is routed along a bus-guide.

15. The system of claim 9, in which the locations for the pipeline flip-flops are placed at equidistant locations along the routing path for the placeholder net.

16. The system of claim 9, in which the locations for the pipeline flip-flops are specified by approximate locations using a region-based structure having a bounding box to define boundaries of possible flip-flop locations.

17. A non-transitory computer readable medium comprising a plurality of computer instructions which, when executed by a processor, cause the processor to execute a process for implementing pipeline flip-flops in an electronic design, comprising:
performing analysis to determine a number of stages of the pipeline flip-flops for the electronic design, the analysis comprises:
routing a group of nets from the electronic design;
selecting a representative net from the group of nets;
calculating a length of the representative net and
determining the number of the stages of the pipe-line flip-flops from the length of the representative net;
automatically placing the pipeline flip-flops in the electronic design, wherein placing the pipeline flip-flops comprises:
replacing a net in the electronic design with a placeholder net;
routing the placeholder net within the electronic design to generate a routing path;
identifying locations for the pipeline flip-flops along the routing path for the placeholder net, wherein the number of the stages of the pipeline flip-flops corresponds to the number of pipeline flip-flops for which the locations are identified along the routing path;
removing the placeholder
inserting the net back into the circuit design;
placing the pipeline flip-flops at the locations that were identified for the pipeline flip-flops; and
displaying results of automatically placing the pipeline flip-flops in the electronic design on a display device or storing the results of automatically placing the pipeline flip-flops in the electronic design in a computer readable storage medium.

18. The non-transitory computer-readable medium of claim 17, in which the representative net is selected from the group of nets based upon a median length.

19. The non-transitory computer-readable medium of claim 17, in which the number of the stages is determined by dividing the length of the net by a maximum wire length between the pipeline flip-flops.

20. The non-transitory computer-readable medium of claim 17, further comprising creating a bus-guide.

21. The non-transitory computer-readable medium of claim 17, wherein the net in the electronic design is replaced with the placeholder net by tracing the net between a start point and an end points to form a path which is then detached and replaced by the placeholder net.

22. The non-transitory computer-readable medium of claim 17, in which the placeholder net is routed along a bus-guide.

23. The non-transitory computer-readable medium of claim 17, in which the locations for the pipeline flip-flops are placed at equidistant locations along the routing path for the placeholder net.

24. The non-transitory computer-readable medium of claim 17, in which the locations for the pipeline flip-flops are specified by approximate locations using a region-based structure having a bounding box to define boundaries of possible flip-flop locations.

\* \* \* \* \*